US008618572B2

(12) United States Patent
Hsu (10) Patent No.: US 8,618,572 B2
(45) Date of Patent: Dec. 31, 2013

(54) LIGHT-EMITTING DEVICE AND METHOD FOR MANUFACTURING THE SAME

(75) Inventor: Chia-Liang Hsu, Hsinchu (TW)

(73) Assignee: Epistar Corporation (TW)

( * ) Notice: Subject to any disclaimer, the term of this patent is extended or adjusted under 35 U.S.C. 154(b) by 129 days.

(21) Appl. No.: 13/403,334

(22) Filed: Feb. 23, 2012

(65) Prior Publication Data

US 2012/0146087 A1    Jun. 14, 2012

Related U.S. Application Data

(63) Continuation of application No. 12/458,133, filed on Jul. 1, 2009, now abandoned.

(30) Foreign Application Priority Data

Jul. 1, 2008    (TW) ................................ 97124823 A
Jul. 24, 2008    (CN) .......................... 2008 1 0134353

(51) Int. Cl.
*H01L 33/00*    (2010.01)

(52) U.S. Cl.
USPC ...... 257/99; 257/102; 257/103; 257/E33.067; 438/46

(58) Field of Classification Search
USPC ......... 257/99, 102, 103, E33.067; 438/22, 46
See application file for complete search history.

(56) References Cited

U.S. PATENT DOCUMENTS 5,502,316 A    3/1996    Kish et al.

FOREIGN PATENT DOCUMENTS

CN    1774820 A    5/2006

*Primary Examiner* — Minh-Loan T Tran
(74) *Attorney, Agent, or Firm* — Bacon & Thomas, PLLC (57) ABSTRACT

A light-emitting device is disclosed. The light-emitting device comprises a substrate, an ion implanted layer on the substrate, a light-emitting stack layer disposed on the ion implanted layer, and an adhesive layer connecting the substrate with the light-emitting stack layer, wherein the adhesive layer comprises a thin silicon film disposed between the ion implanted layer and the light-emitting layer. This invention also discloses a method of manufacturing a light-emitting device comprising the steps of forming a light-emitting stack layer, forming a thin silicon film on the light-emitting stack layer, providing a substrate, forming an ion implanted layer on the substrate, and providing an electrode potential difference to form an oxide layer between the thin silicon film and the ion implanted layer.

20 Claims, 7 Drawing Sheets

LIGHT-EMITTING DEVICE AND METHOD FOR MANUFACTURING THE SAME

REFERENCE TO RELATED APPLICATION

This application is a continuation of U.S. patent application Ser. No. 12/458,133, entitled "Light-emitting Device and Method for Manufacturing the Same", filed on Jul. 1, 2009, now pending, which claims the right of priority based on TW application Ser. No. 097124823, filed on "Jul. 1, 2008", entitled "Light-emitting Device and Method for Manufacturing the Same" and the contents of which are incorporated herein by reference in its entirety.

TECHNICAL FIELD

The application relates to a light-emitting device, and more particularly to a light-emitting diode having an ion implanted layer on the top surface of a substrate.

BACKGROUND

The light-emitting diode (LED) emits light by transforming the energy released from the electrons moving between the n-type semiconductor and the p-type semiconductor so the mechanism is different from that of the incandescent lamp. Thus, the LED is called cold light source. In addition, because the LED has advantages like high reliability, long lifetime, compact size, low power consumption, and so on, the current illumination market expects the LED to be an illuminant tool of the new generation.

The conventional LED structure is a semiconductor epitaxial structure formed on a substrate, wherein the quality of the epitaxy in the semiconductor epitaxial structure has critical influence on the internal quantum efficiency of the LED, and whether the lattice constant of the substrate can match with that of the material of the epitaxial structure is important to the quality of the epitaxy. Therefore, the choice of the substrate materials for the LED is limited.

Figure 1A:
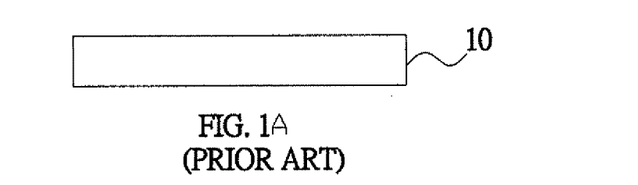
FIGS. 1A-1G are the diagrams illustrating the manufacturing procedure of the conventional light-emitting diode.
Figure 1B:
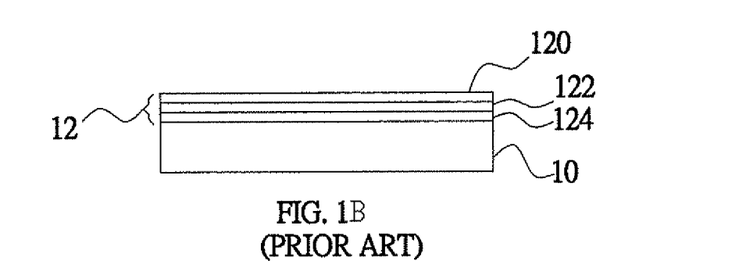
Figure 1C:
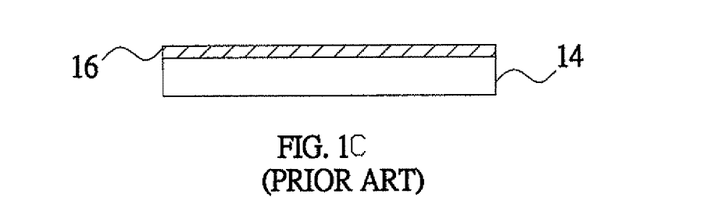
Figure 1D:
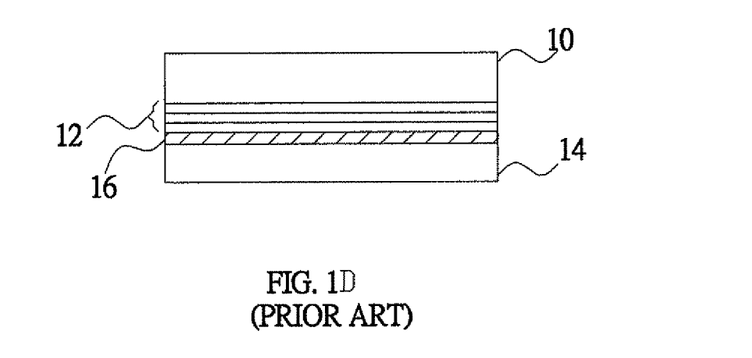
Figure 1E:
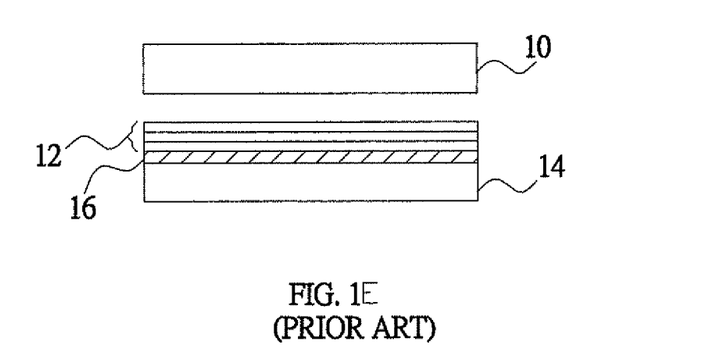
Figure 1F:
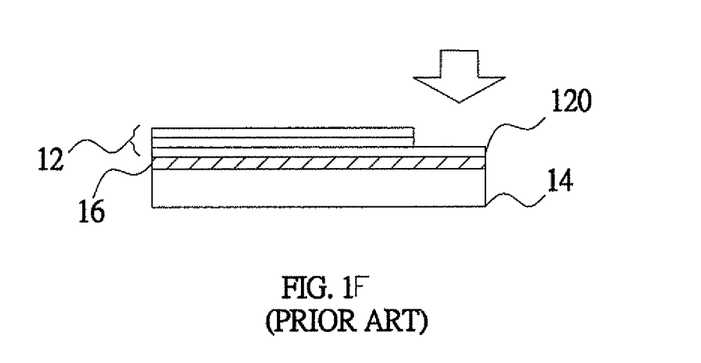
Figure 1G:
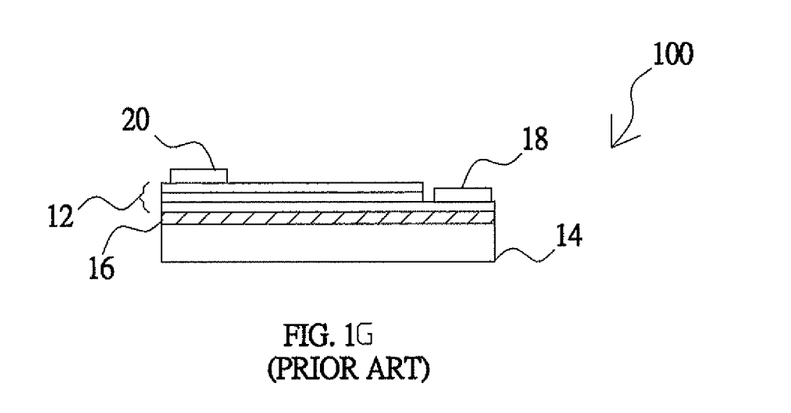

In addition, to improve the light extraction efficiency and heat-dissipation of the LED, the technique of transferring the substrate of the LED comes up gradually. Referring to FIG. 1A to FIG. 1G, a flowchart for a conventional substrate transfer process is illustrated. As shown in FIG. 1A, a first substrate 10 is provided, and an epitaxial structure 12 is provided as shown in FIG. 1B. Referring to FIG. 1C, then a second substrate 14 is provided, and an adhesive layer 16 is, referring to FIG. 1D, formed on the second substrate 14. Later, referring to FIG. 1E, the structure illustrated in FIG. 1A is flipped to attach the epitaxial structure 12 with the second substrate 14 with the adhesive layer 16 by pressed lamination, wherein the material of the adhesive layer 16 can be metal or polymers like PI, BCB, PFCB, and combinations thereof. After that, referring to FIG. 1F, the substrate 10 is removed so as to form a conventional light-emitting diode structure illustrated in FIG. 1G.

SUMMARY

One aspect of the present disclosure discloses a light-emitting device comprising a substrate, an ion implanted layer on the substrate, a light-emitting stack layer disposed on the ion implanted layer, and an adhesive layer connecting the substrate with the light-emitting stack layer, wherein the adhesive layer comprises a thin silicon film disposed between the ion implanted layer and the light-emitting layer.

Another aspect of the present disclosure discloses a method of manufacturing a light-emitting device comprising the steps of forming a light-emitting stack layer, forming a thin silicon film on the light-emitting stack layer, providing a substrate, forming an ion implanted layer on the substrate, and providing an electrode potential difference to form an oxide layer between the thin silicon film and the ion implanted layer.

Other features and advantages of the present application and variations thereof will become apparent from the following description, drawings and claims.

BRIEF DESCRIPTION OF THE DRAWINGS

The accompanying drawings incorporated herein provide a further understanding of the invention therefore constitute a part of this specification. The drawings illustrating embodiments of the invention, together with the description, serve to explain the principles of the invention.

DETAILED DESCRIPTION OF PREFERRED EMBODIMENTS

Figure 2A:
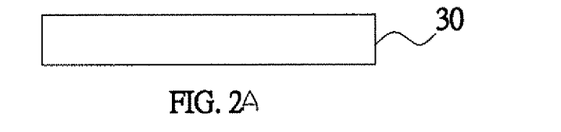
FIGS. 2A-2H are the diagrams illustrating the manufacturing procedure of the light-emitting diode in accordance with one embodiment of the present application.
Figure 2B:
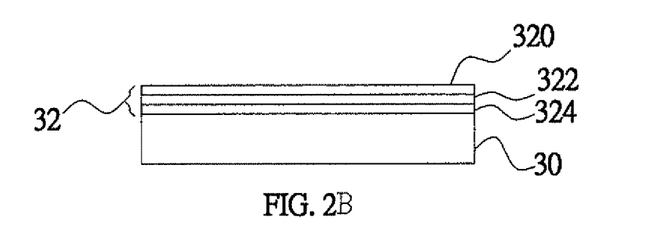

FIGS. 2A-2H are the diagrams illustrating the manufacturing procedure in accordance with one embodiment of the present application, including the following steps: as shown in FIG. 2A, providing a first substrate 30, and as shown in FIG. 2B, forming a light-emitting stack layer 32 by MOCVD (Metal Organic Chemical Vapor Deposition), wherein the light-emitting stack layer 32 includes at least a first-type conductivity semiconductor layer 320, a lighting-emitting layer 322, and a second-type conductivity semiconductor layer 324 from top to bottom, wherein the material of the light-emitting stack layer 32 can be semiconductor materials such as GaAlAs, AlGaInP, GaP or GaN series and combinations thereof. The material of the first substrate 30 can be materials having lattice constant matching with the lattice constant of the light-emitting stack layer 32, such as Sapphire, SiC, GaAs, and so on. In this embodiment, a substrate of SiC and a light-emitting stack layer of GaN are adopted for exemplifying.

Figure 2C:
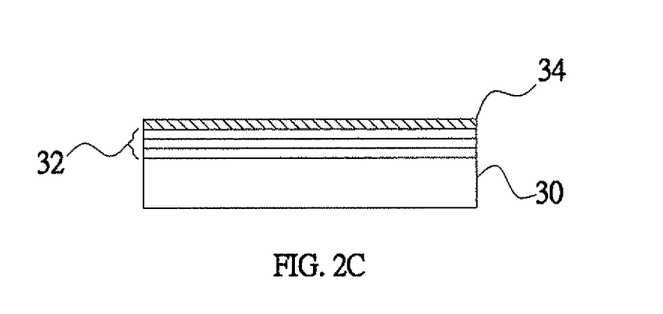

Thereafter, as shown in FIG. 2C, a thin silicon film 34 is formed on the light-emitting stack layer 32 by PECVD (Plasma-enhanced Chemical Vapor Deposition), wherein the material of the thin silicon film 34 in this embodiment is amorphous silicon with a width of 200 nm.

Figure 2D:
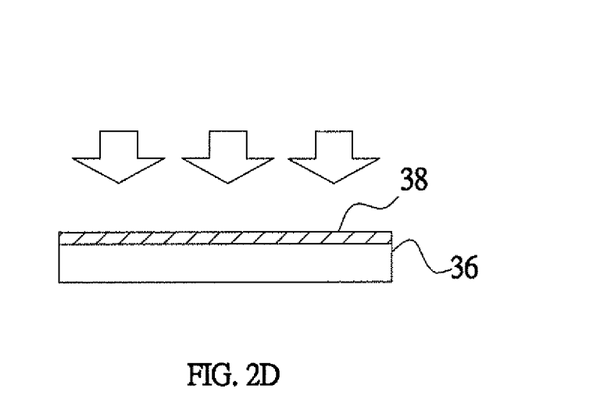

As shown in 2D, the manufacturing procedure further comprises the following steps: providing a second substrate 36, wherein the material of the second substrate 36 could be Oxides such as Sapphire or ZnO, and a Sapphire substrate is used as exemplary in this embodiment, and form an ion implanted layer 38 by implanting sodium ions from the upper side into the second substrate 36 through ion implantation technique, wherein sodium ions in the ion implanted layer 38 are combined with oxygen ions of the Sapphire substrate to form $Na_xO$ molecules.

Figure 2E:
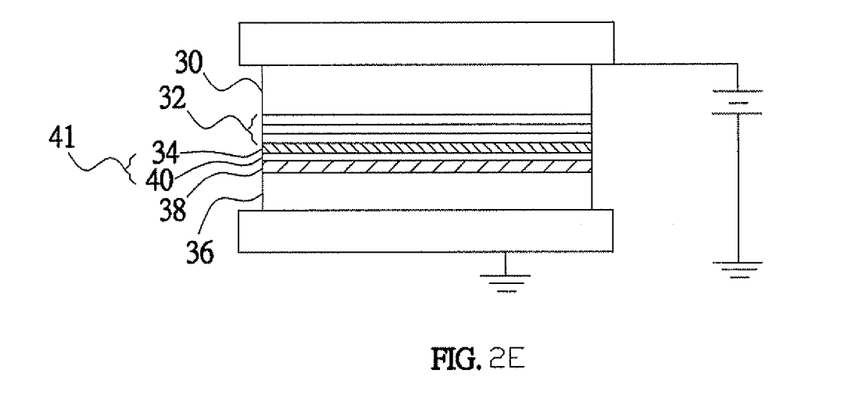

After that, as shown in FIG. 2E, the manufacturing procedure further comprises the steps of flipping the structure shown in FIG. 2C, disposing it on the ion implanted layer 38 to contact the thin silicon layer 34 with the ion implanted layer 38; and providing a voltage between the thin silicon layer 34 and the ion implanted layer 38 wherein the voltage is about 500 to 1200 volts, and the electric potential of the thin silicon layer 34 is higher than the electric potential of the ion implanted layer 38. Due to the electric potential difference between the thin silicon layer 34 and the ion implanted layer 38, the oxygen ions of the $Na_xO$ molecules in the ion implanted layer 38 are forced to move toward the thin silicon layer 34 and form an oxide layer 40 with the thin silicon layer 34 in the interface between the ion implanted layer 38 and the thin silicon layer 34. Therefore, an adhesive layer 41 is formed by the thin silicon layer 34 and the oxide layer 40, and the light-emitting stack layer 32 is attached to the second substrate 36. In this embodiment, the material of the oxide layer 40 is $SiO_2$.

Figure 2F:
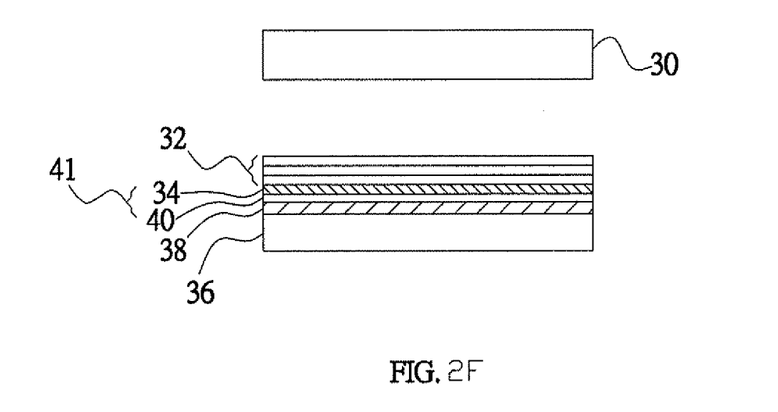
Figure 2G:
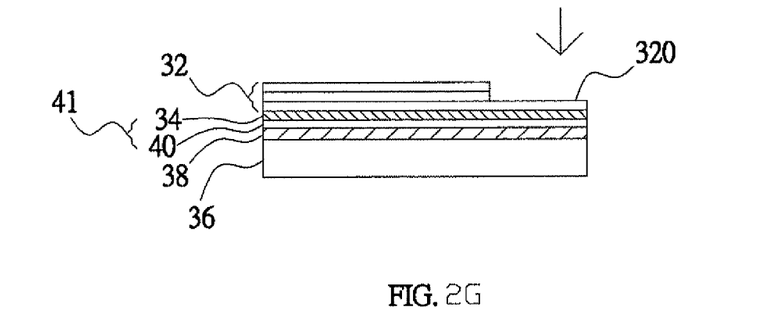
Figure 2H:
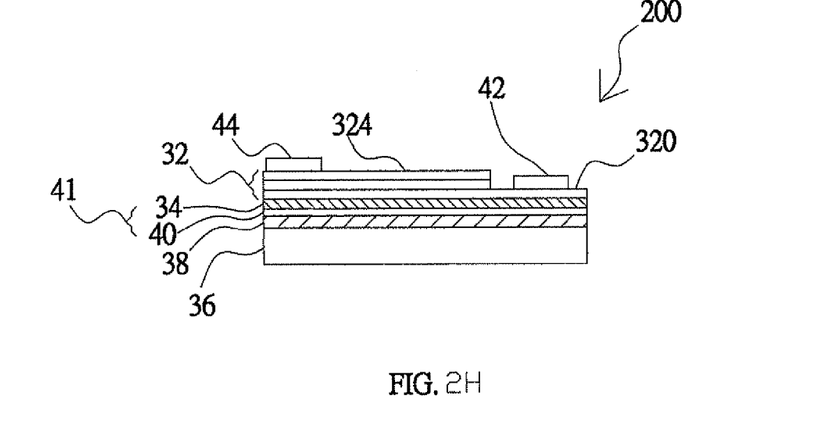

Then, as shown in FIG. 2F, the manufacturing procedure further comprises the steps of removing the first substrate 30 as shown in FIG. 2G, etching part of the light-emitting stack layer 32 by lithography technique to expose part of first-type conductivity semiconductor layer 320 as shown in FIG. 2H, forming a first electrode 42 and a second electrode 44 on the first-type conductivity semiconductor layer 320 and the second-type conductivity semiconductor layer 324 respectively for electrical connection so as to form a light-emitting diode chip 200.

Moreover, in the step of forming the ion implanted layer 38, the second substrate 36 can be disposed in an oxygen-containing environment so the concentration of the $Na_xO$ molecules in the ion implanted layer 38 is increased. In a preferred embodiment, the second substrate 36 is disposed in an environment with sufficient oxygen to perform the step of forming the ion implanted layer 38. In addition, after forming the ion implanted layer 38, the second substrate 36 can be disposed in an oxygen-containing environment for moving the oxygen ions into the ion implanted layer 38 to increase the content of $Na_xO$ molecules in the ion implanted layer 38 by thermal driving method, wherein a preferred embodiment of above thermal driving step is performed with the second substrate 36 disposed in an environment with sufficient oxygen.

In this embodiment, the refractive index of the light-emitting stack layer 32 is about 3.4, the refractive index of the second sapphire substrate 36 is about 1.78, and the refractive index of the ion implanted layer 38 implanted by sodium ions is between the refractive indexes of the light-emitting stack layer 32 and the second sapphire substrate 36, for example, about 1.8 to 2.0. Accordingly, when a light is emitted from the light-emitting stack layer 32, it is out of the LED chip 200 after passing the ion implanted layer 38 and the second sapphire substrate 36. Therefore, the refractive index of above light path is gradually altered from higher value to lower one so as to reduce the total internal reflection effect of light and raise the light extraction efficiency of the LED chip 200.

Figure 3A:
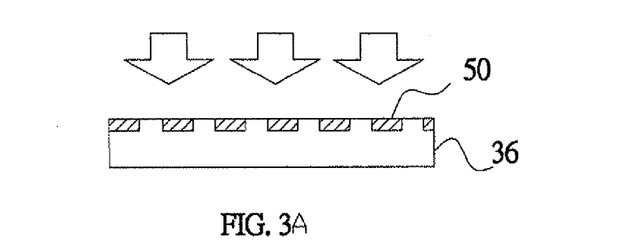
FIGS. 3A-3E are the diagrams illustrating the manufacturing procedure of the light-emitting diode in accordance with another embodiment of the present application.

FIGS. 3A-3E are the diagrams illustrating the manufacturing procedure in accordance with another embodiment of the present application. As shown in FIG. 3A, the manufacturing procedure comprises the steps of providing a second substrate 36 and forming a patterned ion implanted layer 50 on the surface of the second substrate 36. The patterned ion implanted layer 50 has regular symmetry or irregular asymmetry patterns, wherein a regular symmetry patterned ion implanted layer is defined as a patterned ion implanted layer showing identical reduplicating characteristics in any direction of the surface of the second sapphire substrate 36, and the term "regular" could be defined as periodic, varied periodic, quasiperodicity or combinations thereof. The irregular asymmetry patterned ion implanted layer is defined as a patterned ion implanted layer unable to show identical reduplicating characteristics in any direction of the surface of the second sapphire substrate 36. Additionally, in this embodiment, the ion implanted layer 50 covers about 15% to 85% of the surface area of the second substrate 36, and the better is 30% to 60% of the surface area. Furthermore, in this ion implanted step, ion source at least comes from sodium ions and the ion source sodium ions forms $Na_xO$ molecules in the patterned ion implanted layer 50.

Figure 3B:
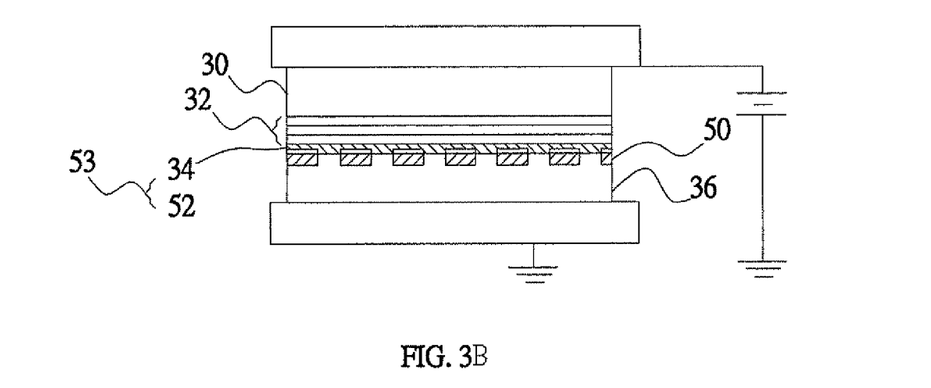

After that, as shown in FIG. 3B, the manufacturing procedure further comprises the steps of flipping the structure illustrated in FIG. 2C to contact the thin silicon layer 34 with the second substrate 36 and the patterned ion implanted layer 50; providing a voltage among the patterned ion implanted layer 50, the thin silicon layer 34 and the second substrate 36, wherein the voltage is about 500 to 1200 volts in this step, and the electric potential of the thin silicon layer 34 is higher than the electric potential of the patterned ion implanted layer 50. Due to the electric potential difference between the thin silicon layer 34 and the patterned ion implanted layer 50, the oxygen ions of the $Na_xO$ molecules in the patterned ion implanted layer 50 are forced to move toward the thin silicon layer 34 and form an oxide layer 52 in the interface between the patterned ion implanted layer 50 and the thin silicon layer 34. Therefore, an adhesive layer 53 is formed by the thin silicon layer 34 and the oxide layer 52, and the light-emitting stack layer 32 is attached to the second substrate 36. In this embodiment, the material of the oxide layer 52 is SiO2.

Figure 3C:
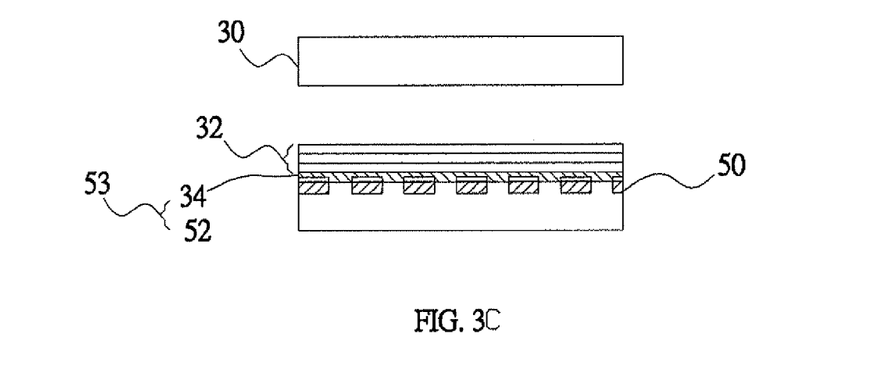
Figure 3D:
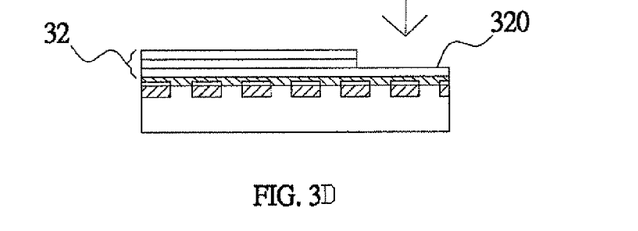
Figure 3E:
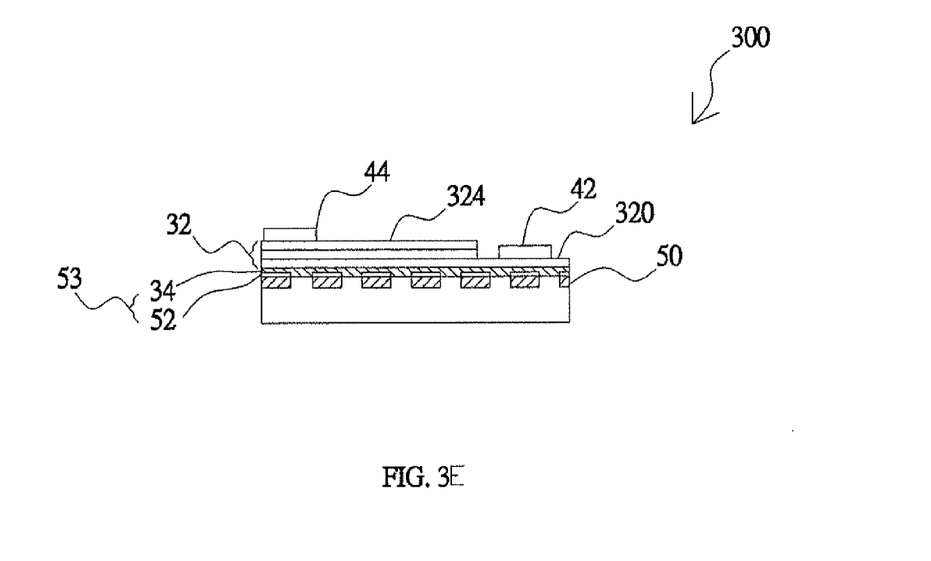

Then, as shown in FIG. 3C, the manufacturing procedure further comprises the steps of removing the first substrate 30; etching part of the light-emitting stack layer 32, as shown in FIG. 3D, to expose part of the first-type conductivity semiconductor layer 320 by lithography technique. Finally, as shown in FIG. 3E, forming a first electrode 42 and a second electrode 44 on the first-type conductivity semiconductor layer 320 and the second-type conductivity semiconductor layer 324 respectively for electrically connecting the first electrode with the first conductivity semiconductor layer and the second electrode with the second conductivity semiconductor layer so as to form a light-emitting diode chip 300.

In this embodiment, the material of the second substrate 36 is Sapphire with the refractive index of about 1.78, and the refractive index of the patterned ion implanted layer 50 implanted by sodium ions, for example, on the surface of the second sapphire substrate 36, is about 1.8 to 2.0. The refractive index difference between the material of the second substrate 36 and the patterned ion implanted layer 50 reduces the total internal reflection effect of light emitted from the light-emitting stack layer 32 in the LED chip 300 so as to further increase the luminescent extraction efficiency.

The foregoing description has been directed to a specific embodiment of this invention. It will be apparent; however, that other variations and modifications may be made to the described embodiments, with the attainment of some or all of their advantages. Therefore, it is the object of the appended claims to cover all such variations and modifications that fall within the spirit and scope of the invention.

What is claimed is:
1. A method of manufacturing a light-emitting device comprising the steps of:
    forming a light-emitting stack layer;
    forming a thin silicon film on the light-emitting stack layer;
    providing a second substrate;
    forming an ion implanted layer on the second substrate; and providing an electrode potential difference to form an oxide layer between the thin silicon film and the ion implanted layer.

2. The method of manufacturing a light-emitting device according to claim 1, wherein the step of forming the light-emitting stack layer comprises the steps of:
providing a first substrate;
forming a first-type conductivity semiconductor layer on the first substrate;
forming a light-emitting layer on the first-type conductivity semiconductor layer; and
forming a second-type conductivity semiconductor layer on the light-emitting layer.

3. The method of manufacturing a light-emitting device according to claim 2, further comprising the step of removing the first substrate; and the step of forming at least an electrode on the light-emitting stack layer.

4. The method of manufacturing a light-emitting device according to claim 1, wherein the step of forming the ion implanted layer comprises a step of forming a patterned ion implanted layer.

5. The method of manufacturing a light-emitting device according to claim 4, wherein the patterned ion implanted layer has a pattern selected from the group consisting of a regular symmetry pattern and an irregular asymmetry pattern.

6. The method of manufacturing a light-emitting device according to claim 4, wherein the patterned ion implanted layer covers about 15% to 85% of the surface area of the second substrate.

7. The method of manufacturing a light-emitting device according to claim 4, wherein the patterned ion implanted layer covers about 30% to 60% of the surface area of the second substrate.

8. The method of manufacturing a light-emitting device according to claim 1, wherein the step of forming an ion implanted layer on the second substrate is proceeded in an oxygen-containing environment, and the ions implanted in the ion implanted layer comprises sodium ions.

9. The method of manufacturing a light-emitting device according to claim 1, further comprising a step of thermal driving the ion implanted layer in an oxygen-containing environment.

10. The method of manufacturing a light-emitting device according to claim 1, wherein the electrode potential difference is between 500 volts to 1200 volts.

11. A light-emitting device, comprising:
a substrate;
an ion implanted layer on the substrate;
a light-emitting stack layer disposed on the ion implanted layer; and
an adhesive layer connecting the substrate with the light-emitting stack layer;
wherein the adhesive layer comprises a thin silicon film disposed between the ion implanted layer and the light-emitting layer.

12. A light-emitting device according to claim 11, wherein the adhesive layer is a multi-layer structure.

13. A light-emitting device according to claim 11, wherein the adhesive layer further comprising an oxide layer disposed between the ion implanted layer and the thin silicon film.

14. A light-emitting device according to claim 11, wherein the light-emitting stack layer further comprises:
a first-type conductivity semiconductor layer disposed on the thin silicon film;
a light-emitting layer disposed on the first-type conductivity semiconductor layer; and
a second-type conductivity semiconductor layer disposed on the light-emitting layer.

15. A light-emitting device according to claim 14, further comprising a first electrode and a second electrode respectively disposed on the first-type conductivity semiconductor layer and the second-type conductivity semiconductor layer.

16. A light-emitting device according to claim 11, wherein the ion implanted layer comprises sodium ions.

17. A light-emitting device according to claim 11, wherein the ion implanted layer comprises a patterned ion implanted layer.

18. A light-emitting device according to claim 17, wherein the patterned ion implanted layer has a pattern selected from the group consisting of a regular symmetry pattern and an irregular asymmetry pattern.

19. A light-emitting device according to claim 17, wherein the patterned ion implanted layer covers about 15% to 85% of the surface area of the second substrate.

20. A light-emitting device according to claim 17, wherein the patterned ion implanted layer covers about 30% to 60% of the surface area of the second substrate.

* * * * *